(12) United States Patent
Kabir et al.

(10) Patent No.: US 12,183,520 B2
(45) Date of Patent: Dec. 31, 2024

(54) METAL-INSULATOR-METAL (MIM) ENERGY STORAGE DEVICE WITH LAYERED STACK AND MANUFACTURING METHOD

(71) Applicant: Smoltek AB, Gothenburg (SE)

(72) Inventors: M Shafiqul Kabir, Västra Frölunda (SE); Vincent Desmaris, Gothenburg (SE); Anders Johansson, Öckerö (SE); Ola Tiverman, Västra Frölunda (SE); Karl Lundahl, Gothenburg (SE); Rickard Andersson, Gothenburg (SE); Muhammad Amin Saleem, Gothenburg (SE); Maria Bylund, Gothenburg (SE); Victor Marknäs, Mölndal (SE)

(73) Assignee: Smoltek AB, Gothenburg (SE)

( * ) Notice: Subject to any disclaimer, the term of this patent is extended or adjusted under 35 U.S.C. 154(b) by 215 days.

(21) Appl. No.: 17/911,698

(22) PCT Filed: Apr. 13, 2021

(86) PCT No.: PCT/SE2021/050335
§ 371 (c)(1),
(2) Date: Sep. 15, 2022

(87) PCT Pub. No.: WO2021/211038
PCT Pub. Date: Oct. 21, 2021

(65) Prior Publication Data
US 2023/0147809 A1 May 11, 2023

(30) Foreign Application Priority Data
Apr. 17, 2020 (SE) .................... 2050444-5

(51) Int. Cl.
*H01G 9/04* (2006.01)
*H01G 9/07* (2006.01)
(Continued)

(52) U.S. Cl.
CPC ................. *H01G 9/04* (2013.01); *H01G 9/07* (2013.01); *H01G 9/15* (2013.01); *H01L 28/91* (2013.01);
(Continued)

(58) Field of Classification Search
CPC ... H01G 9/04; H01G 9/07; H01G 9/15; H01L 28/91; H05K 1/181; H05K 2201/10015
(Continued)

(56) References Cited

U.S. PATENT DOCUMENTS 8,085,524 B2 * 12/2011 Roozeboom ........ H01L 27/0805
361/301.2
8,298,944 B1 * 10/2012 West ..................... H01L 23/562
257/E21.597
(Continued)

FOREIGN PATENT DOCUMENTS

EP 2074641 A1 7/2009
WO 2008040706 A1 4/2008
(Continued)

OTHER PUBLICATIONS

International Search Report and Written Opinion from International Application No. PCT/SE2021/050335, dated Apr. 29, 2021.
(Continued)

*Primary Examiner* — Timothy J Thompson
*Assistant Examiner* — Michael F McAllister
(74) *Attorney, Agent, or Firm* — Westman, Champlin & Koehler, P.A.

(57) ABSTRACT

A MIM energy storage device comprising a bottom electrode; a plurality of electrically conductive vertical nano-
(Continued)

structures; a bottom conduction-controlling layer conformally coating each nanostructure in the plurality of electrically conductive vertical nanostructures; and a layered stack of alternating conduction-controlling layers and electrode layers conformally coating the bottom conduction-controlling layer, the layered stack including at least a first odd-numbered electrode layer at a bottom of the layered stack, a first odd-numbered conduction-controlling layer directly on the first odd-numbered electrode layer, and a first even-numbered electrode layer directly on the first odd-numbered conduction-controlling layer. Each even-numbered electrode layer in the layered stack is electrically conductively connected to the bottom electrode; and each odd-numbered electrode layer in the layered stack is electrically conductively connected to any other odd-numbered electrode layer in the layered stack.

18 Claims, 10 Drawing Sheets

(51) Int. Cl.
  *H01G 9/15* (2006.01)
  *H01L 49/02* (2006.01)
  *H05K 1/18* (2006.01)

(52) U.S. Cl.
  CPC ... *H05K 1/181* (2013.01); *H05K 2201/10015* (2013.01)

(58) Field of Classification Search
  USPC .......................................................... 361/782
  See application file for complete search history.

(56) References Cited

U.S. PATENT DOCUMENTS

| | | | |
|---|---|---|---|
| 8,420,476 B2* | 4/2013 | Booth, Jr. | H01L 21/823821 438/210 |
| 8,610,281 B1* | 12/2013 | Nguyen | H01L 23/481 257/770 |
| 8,816,420 B1* | 8/2014 | Basker | H01L 27/1211 257/300 |
| 9,412,806 B2* | 8/2016 | Wang | H01L 28/90 |
| 10,388,572 B2* | 8/2019 | Cheng | H01L 27/0629 |
| 10,665,393 B2* | 5/2020 | Ryou | H01G 2/06 |
| 10,950,689 B2* | 3/2021 | Lin | H01L 28/91 |
| 2005/0121744 A1 | 6/2005 | Chang et al. | |
| 2006/0186451 A1 | 8/2006 | Dusberg et al. | |
| 2008/0197399 A1* | 8/2008 | Hsu | B82Y 10/00 257/E29.345 |
| 2010/0118465 A1* | 5/2010 | Onishi | H01G 4/01 257/532 |
| 2010/0244189 A1* | 9/2010 | Klootwijk | H01L 28/90 257/532 |
| 2011/0298025 A1* | 12/2011 | Haensch | H01L 27/0805 257/E21.616 |
| 2012/0181658 A1 | 7/2012 | Mohammed et al. | |
| 2013/0009249 A1* | 1/2013 | Basker | H01L 29/7843 257/E27.06 |
| 2013/0250479 A1 | 9/2013 | Manohara et al. | |
| 2014/0231891 A1* | 8/2014 | Basker | H01L 29/785 257/296 |
| 2016/0064608 A1* | 3/2016 | Chung | H01L 33/18 257/13 |
| 2016/0315138 A1* | 10/2016 | Li | H01L 28/92 |
| 2017/0012029 A1 | 1/2017 | Lambert et al. | |
| 2018/0374658 A1 | 12/2018 | Gao | |
| 2019/0051591 A1* | 2/2019 | Kabir | H01L 23/147 |
| 2019/0319587 A1* | 10/2019 | Srinidhi Embar | H03F 1/565 |
| 2020/0051749 A1* | 2/2020 | Suemasa | H01G 4/33 |
| 2020/0321444 A1* | 10/2020 | Lien | H10B 43/35 |
| 2021/0151553 A1* | 5/2021 | Kim | H10B 12/315 |

FOREIGN PATENT DOCUMENTS

| | | |
|---|---|---|
| WO | 2017151040 A1 | 9/2017 |
| WO | 2019045619 A1 | 3/2019 |

OTHER PUBLICATIONS

A. M. Saleem et al., "Integrated on-chip solid state capacitor based on vertically aligned carbon nanofibers, grown using a CMOS temperature compatible process", Solid State Electronics, vol. 139, 75-79 (Jan. 2018); DOI: 10.1016/j.sse.2017.10.037.

Extended European Search Report from European Patent Application No. 21788774.4, dated Apr. 30, 2024.

* cited by examiner

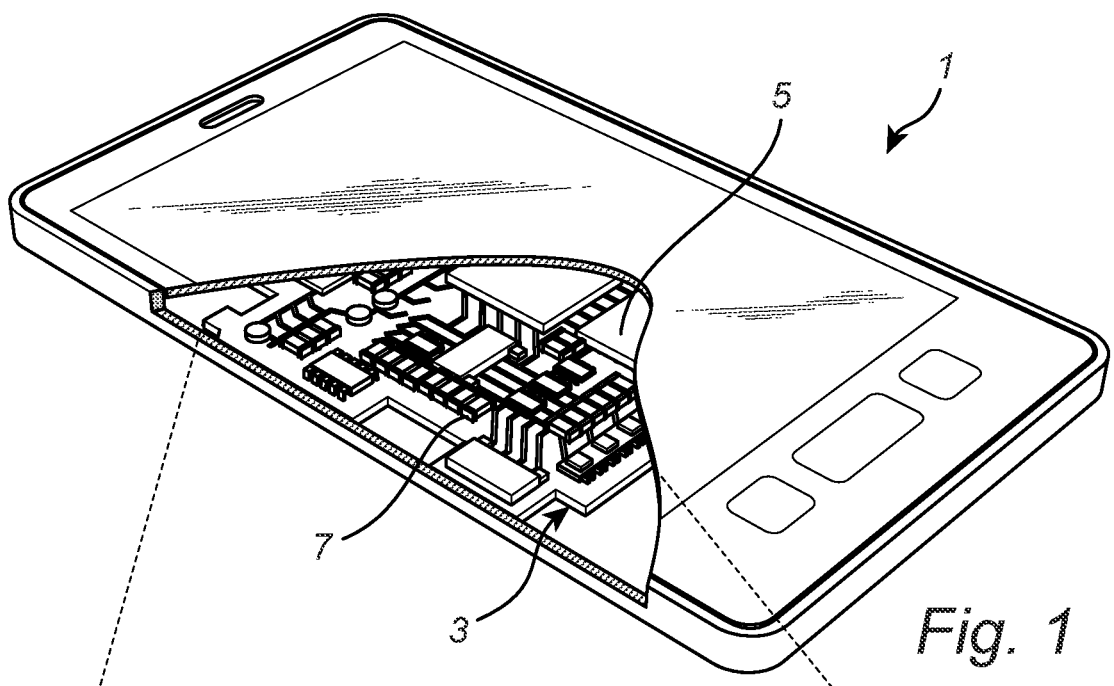
Fig. 1
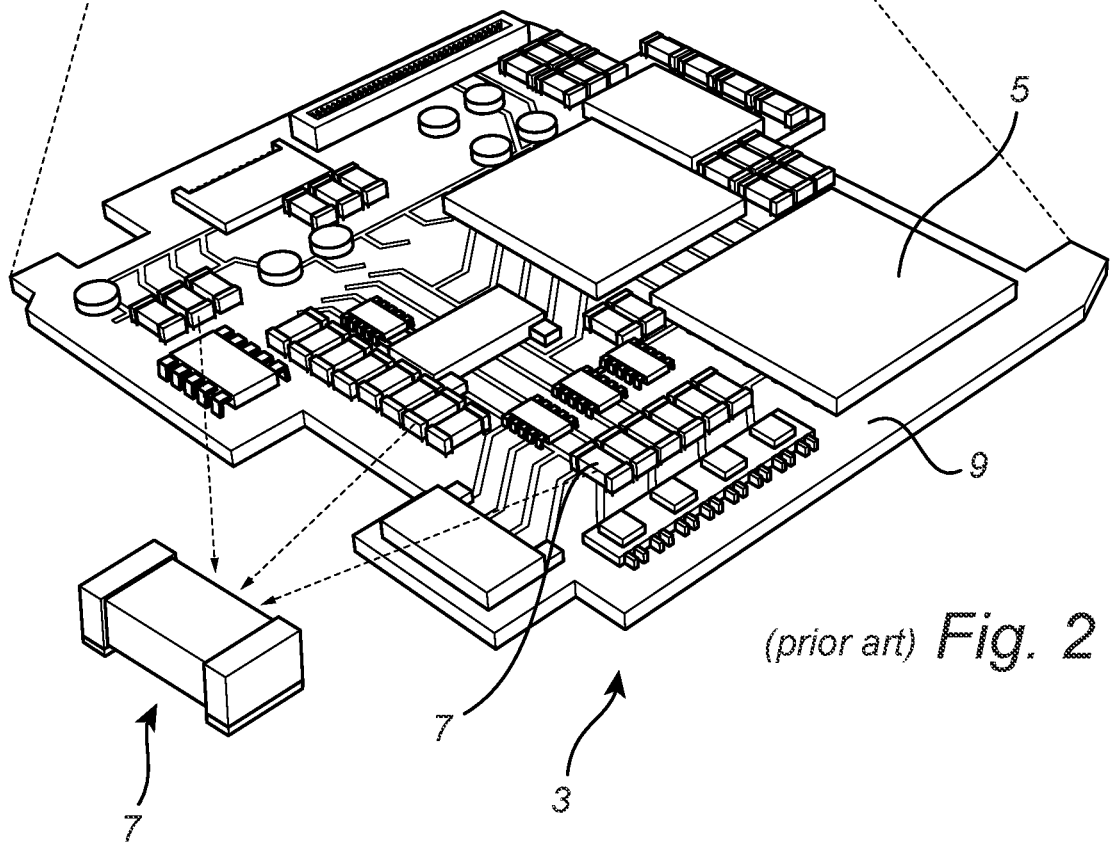
(prior art) Fig. 2

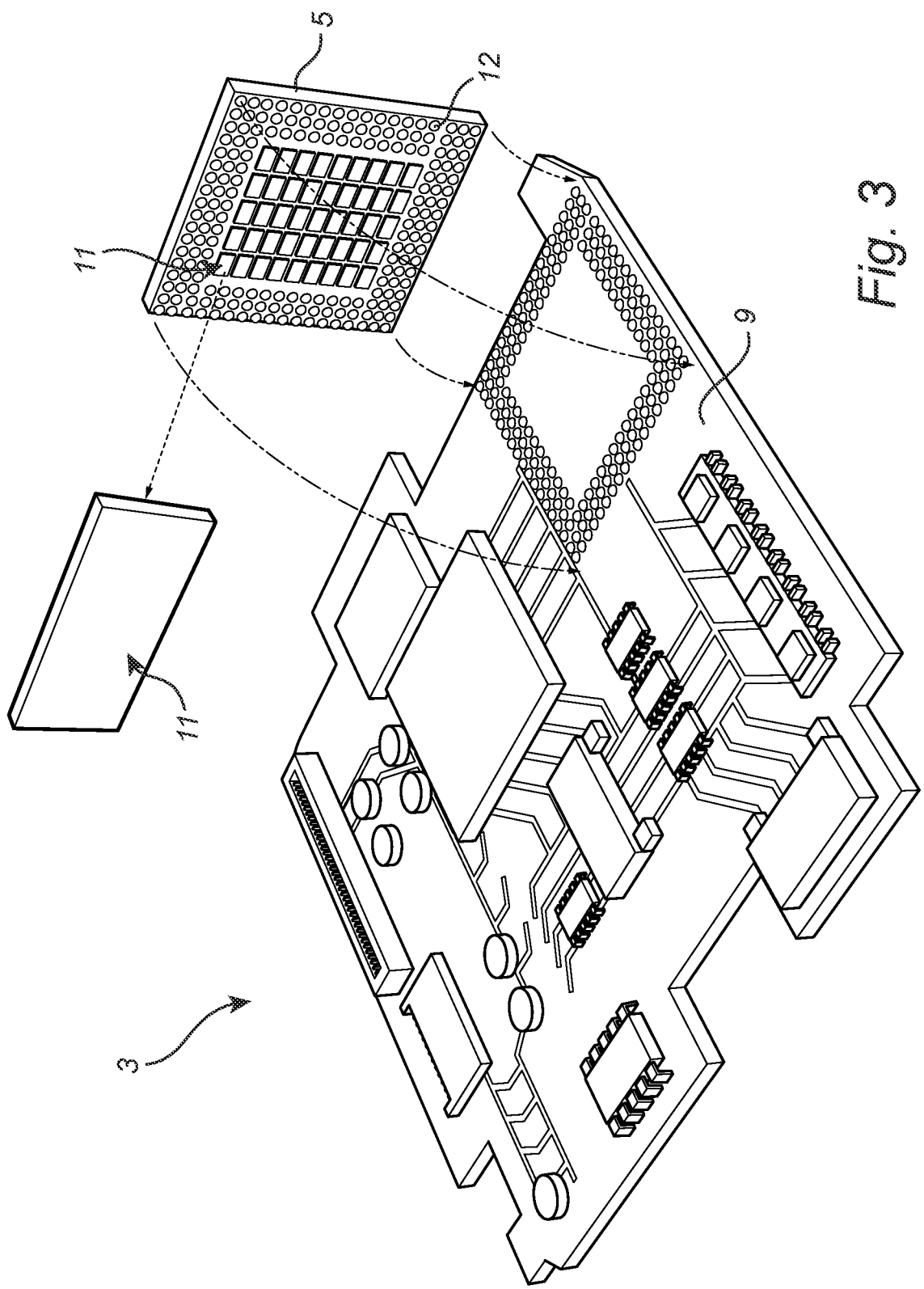

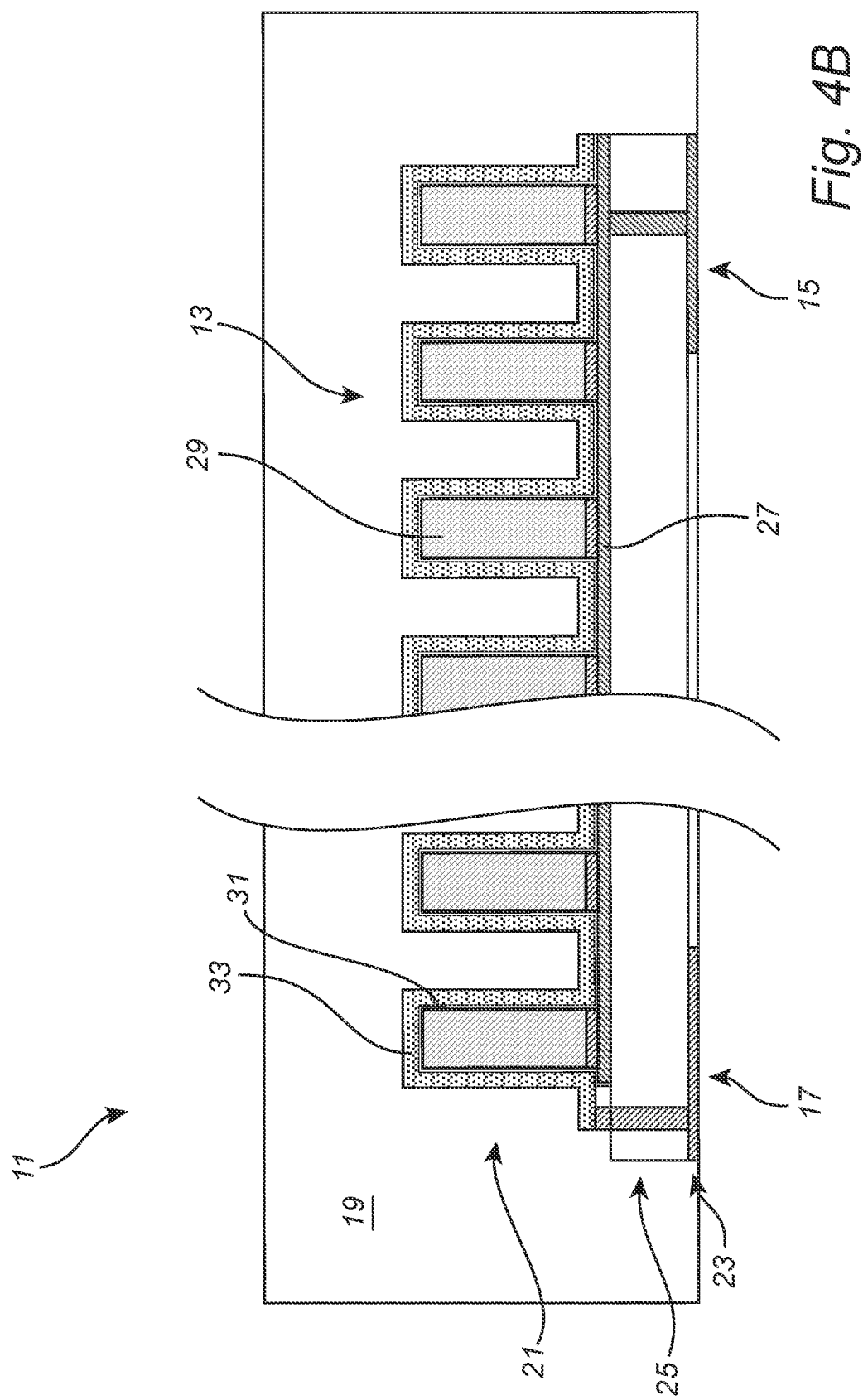

METAL-INSULATOR-METAL (MIM) ENERGY STORAGE DEVICE WITH LAYERED STACK AND MANUFACTURING METHOD

CROSS-REFERENCE TO RELATED APPLICATION

This Application is a Section 371 National Stage Application of International Application No. PCT/SE2021/050335, filed Apr. 13, 2021, and published as WO 2021/211038 on Oct. 21, 2021, in English, which claims priority to Swedish Application No. 2050444-5, dated Apr. 17, 2020, the contents of which are hereby incorporated by reference in their entireties.

FIELD OF THE INVENTION

The present invention relates to metal-insulator-metal (MIM) electrostatic and/or electrochemical energy storage devices, including capacitors and batteries, and to a method of manufacturing such metal-insulator-metal (MIM) energy storage devices.

BACKGROUND OF THE INVENTION

Miniaturization of electronics has been the trend for many decades which has enabled us to witness different kinds of gadgets with many functionalities. To a large part, this progress was enabled by miniaturizing and integrating transistors, resistors and capacitors for logic applications onto silicon. By comparison, passive components (resistors, capacitors, and inductors) at the circuit-board level have made only incremental advances in size and density. As a consequence, passive components occupy an increasingly larger area and mass fraction of electronic systems and are a major hurdle for further miniaturization of many electronic systems with lower system cost. Current smartphones typically use more than 1000 discrete capacitor components. A circuit board of an electric car utilizes roughly 10000 such discrete capacitor components and the trend is upwards. The need for such large numbers of capacitors is primarily driven by the need to tackle the problem with power management systems driving the power all the way from the source of energy (battery/mains power) through the packaging schemes (PCB/SLP/SoC/SiP) to the functional silicon chip/die, and to the on chip integrated circuits. There are different power management problems to tackle at different stages of integrations of such gadgets.

Miniaturization of silicon circuits has enabled us to achieve more functions per unit area. Such achievements have come with a price and have stressed the power management system of the die to the extreme. Today's silicon chips suffer heavily from power noise induced by leakage current from the transistors, high frequency reflections in the interconnect grids, parasitics switching noise etc. along the power grid. Such power noise can cause voltage fluctuation and impedance mismatch of the circuit and may result in gate delay and logic errors, jitter, etc. and can be catastrophic. It is a vast area of research on how to tackle such on-chip power management solutions. One of the ways to tackle such problem is to use metal insulator metal (MIM) decoupling capacitors integrated with the circuit. However, such integrated schemes to tackle the problems inside of a die is limited by white space (expensive real estate space available on die) to integrate decoupling capacitors on the surface of the die. It is reported that the white space is decreasing and that only about 10% is allocated in today's generation per die, for on chip decoupling capacitors.

Therefore, there is a need for increasing the capacitance density of such decoupling capacitors within the stipulated 2D area. Some solutions are proposed and demonstrated in A. M. Saleem et al., 'Integrated on-chip solid state capacitor based on vertically aligned carbon nanofibers, grown using a CMOS temperature compatible process', Solid State Electronics, vol. 139, 75 (January 2018), and in EP2074641. The prior arts have shown improvements of the capacitive values with respect to traditional MIM capacitors. The demonstrated devices are, however, prone to suffer from the parasitic capacitances from the field oxide present on the contact points, or from the nanostructure growing randomly outside of the device area causing unintentional and uncontrolled parasitic effects (capacitive/resistive/inductive) to be present in the device which may cause detrimental effects for circuit implementation. A lot of design and processing improvement steps are anticipated to be needed (for example CMP planarization processing, field oxide removal etc.) to make such a device free of parasitics which essentially diminishes the benefits of such technology concepts for practical implementations.

Looking from another point of view—the PCB/SLP board level—the power supply rails (e.g., ±2.5V, ±12V or 3.3V etc) providing the power in most cases is typically produced by linear power supply or switched mode power supply techniques. Despite that they both have rectification and filtering or regulation stage prior to feeding to the power grid of the electronic circuits, they still may possess ripple noise. Hence a lot of capacitors are typically found on the board, and the quantity and value of capacitors become higher as the switching frequency of the IC rises. Moreover, the power supply requirements and noise margins are becoming more and more stringent as the power supply requirements of ICs are progressing towards lower operating voltages. Additionally, with advancement in the system level packaging like SoC/SiP, FOWLP/FIWLP/Chiplet wafer level packaging of dissimilar ICs/heterogeneous integrations, power management is becoming a dominant issue. Noise may occur in the voltage levels either due to poor power supply regulation, length/shape of PCB power interconnects, wire parasitics, switching frequencies of ICs and EMI effects etc. For such complex integrated packages, capacitors closer to the different ICs are required for better performances.

Today's industry standard MLCC/TSC/LICC capacitor technologies to manufacture such discrete components are challenged to comply with the increasing demand for lower height (Z height) to be sub 100 μm and preferably below 20 μm. This demand is due to the fact that the ICs that are integrated in packaging SoC/SiP packaging require sub 70 μm height of the capacitor to accommodate between the SoC/SiP packaging solutions due to decrease in the bump interconnects height and pitch/spacing.

To circumvent this issue, US20170012029 demonstrates embodiments to accommodate a MIM capacitor configuration at the back side of a die. Such a scheme, however, needs to be CMOS compatible and must be done on every die that is to be assembled. This may entail the limitations of such technology concepts due to adaptation complexities of such MIM structure in different technology nodes and costs associated with such implementation. This may essentially increase the cost per die substantially and may slay the cost benefits per function that is needed at a packaging level.

MLCC is the most prominent type of discrete capacitor component used in the world. Trillions of such discrete components are used every year in any given system/gadget.

There has been some progress in miniaturizing these components and the thinnest that can be found commercially is claimed by Taiyo Yuden to be 110 µm. Samsung Electro-Mechanical system have introduced the concept of LICC to reduce the thickness and reach lower ESL (Effective Series Inductance) even further. Ipdia (now part of Murata) has introduced TSC discrete capacitor component to be as thin as 80 µm with a capacitance value exceeding 900 nF/mm$^2$. However, MLCC, LICC and TSC are prone to struggle to going down in Z dimension (height) further due to materials involved (raw metal/dielectric particles), processing schemes (sintering/silicon etching) and cost of raw materials and processing. The MLCC process requires a thorough understanding of the limitations of the raw materials used in capacitor manufacturing, including copper, nickel, silver, gold, tantalum, barium titanate, alumina etc. It is also known that the ceramic class 2 MLCC suffers negatively under temperature variations, applied voltage and over time (aging) results in significant degradation of capacitance values from the originally stipulated capacitance values by the vendors. Such degradation can adversely affect any subsystem related to security of a system (e.g. electric car).

Further miniaturization of these components based on those established technologies thus may not be as cost competitive as it was before. It is particularly challenging to match with the need to be small enough both in 2D and in 3D space such that the discrete capacitor components can fit between the flip chip bumps interconnects without compromising the cost.

Discrete capacitor components need to be produced in trillions to fulfil the industrial demand and CMOS compatible technologies are simply cost prohibitive to be exploited for producing discrete components with respect to MLCC or LICC or TSC.

SUMMARY

It is therefore evident that there is a large gap between the integrated capacitor and discrete capacitor components that need innovative solutions. The same applies to other types of energy storage devices.

According to a first aspect of the present invention, it is therefore provided metal-insulator-metal (MIM) energy storage device comprising: a plurality of electrically conductive vertical nanostructures, each extending from a first end of the nanostructure to a second end of the nanostructure; a bottom conduction-controlling layer conformally coating each nanostructure in the plurality of electrically conductive vertical nanostructures; and a layered stack comprising alternating conduction-controlling layers and electrode layers conformally coating the bottom conduction-controlling layer, the layered stack including at least a first odd-numbered electrode layer at a bottom of the layered stack, a first odd-numbered conduction-controlling layer directly on the first odd-numbered electrode layer, and a first even-numbered electrode layer directly on the first odd-numbered conduction-controlling layer, wherein: each even-numbered electrode layer in the layered stack is electrically conductively connected to the nanostructures; and each odd-numbered electrode layer in the layered stack is electrically conductively connected to any other odd-numbered electrode layer in the layered stack.

The MIM energy storage device may comprise a bottom electrode, and the first end of each nanostructure in the plurality of electrically conductive vertical nanostructures may be in electrically conductive contact with the bottom electrode. Each even-numbered electrode layer in the layered stack may then be electrically conductively connected to the bottom electrode.

By "vertical" nanostructure should be understood a nanostructure that is arranged perpendicular to the bottom electrode.

In the context of the present application, the term "conformally coating" should be understood to mean depositing on a surface a layer of material in such a way that the thickness of the layer of material becomes substantially the same regardless of the orientation of the surface. Various deposition method for achieving such so-called conformal layers or films are well-known to those skilled in the art. Notable examples of deposition methods that may be suitable are various vapor deposition methods, such as CVD, ALD, and PVD.

An electrically conductive nanostructure may be formed from an electrically conductive material, or it may be formed from an electrically insulating material and coated, preferably conformally, with a conductive material, such as a metal. In the latter case, the first end of the nanostructure may be in electrically conductive contact with the bottom electrode by means of the conductive material at the first end of the nanostructure. Alternatively, the electrically conductive material covering a non-conductive nanostructure may act as a bottom electrode for the MIM energy storage device.

The bottom conduction-controlling layer may at least conformally coat each nanostructure, and may thus additionally conformally coat portions of the bottom electrode between the nanostructures.

The layered stack may advantageously comprise a plurality of conformally coating layers. For instance, all of the layers in the layered stack may be conformally coating layers. In embodiments, however, the topmost electrode layer in the layered stack may not be a conformally coating layer.

The present invention is based on the realization that the energy storage capacity per unit surface area of a nanostructure-based MIM energy storage device can be increased considerably by providing, on top of a bottom conformal conduction-controlling layer, a layered stack with alternating electrode layers and conduction-controlling layers, and selectively interconnecting the electrode layers in the device to achieve a parallel coupled energy storage circuit. This approach can provide for a considerably increased energy storage capacity.

According to various embodiments, the MIM energy storage device may further comprise a top electrode parallel to the bottom electrode; and a topmost odd-numbered electrode layer in the layered stack may be electrically conductively connected to the top electrode. The top electrode may include a substantially planar top electrode surface, while the bottom of the top electrode may be planar or structured, depending on the configuration of the MIM energy storage device.

For various applications, this may be an advantageous and convenient way of providing for external connection of the parallel coupled energy storage circuit. In embodiments, fewer process steps may be required and/or coarser conductor patterns may be used, which may provide for an improved production yield, and therefore also for a lower cost of production.

Advantageously, the topmost odd-numbered electrode layer in the layered stack may be electrically conductively connected to the top electrode at a plurality of connection locations, each being along a straight line passing through the first end and the second end of a respective one of the nanostructures in the plurality of electrically conductive vertical nanostructures. This configuration provides for a relatively simple and reliable connection configuration, which is also compact.

The conductive nanostructures may advantageously be carbon nanofibers (CNF). Alternatively, the conductive nanostructures may be carbon nanotubes (CNT) or carbide-derived carbon nanostructures or graphene walls. In embodiment, moreover, the nanostructures may be nanowires, for example made of copper, aluminum, silver, silicide, or other types of nanowires with conductive properties.

The use of CNF may, however, be particularly advantageous for energy storage devices according to embodiments of the present invention. CNTs are known to be capable of providing a higher conductivity than CNFs. However, processes to form conductive CNTs also tend to result in the formation of a proportion of semiconducting CNTs, and this proportion may not be known or precisely controllable. CNFs, on the other hand, have metallic (electric) properties, which provides for improved reproducibility. Furthermore, the surface area of a CNF can be made considerably larger than the surface area of a CNT with the same overall dimensions (diameter and height), which provides for more charge accumulation sites, and thereby a higher charge carrying capability, in turn resulting in a higher energy storage capability for the same number and overall dimensions of nanostructures in the MIM energy storage device.

In embodiments, the carbon nanofibers may be at least partly formed by amorphous carbon. This results in a higher number of carbon atoms per surface area, resulting in more charge accumulation sites, which in turn results in a higher energy storage capability for the same number and overall dimensions of nanostructures in the MIM energy storage device.

In embodiments, the carbon nanofibers may be branched carbon nanofibers. This may result in a further increase of the accessible surface area, resulting in more charge accumulation sites, which in turn results in a higher charge storage capability for the same number and overall dimensions of nanostructures in the MIM energy storage device.

According to embodiments, furthermore, each CNF in the plurality of CNFs may have a corrugated surface structure, which also increases the number of charge accumulation sites (per CNF).

To fully benefit from the use of CNFs with corrugated surface structures or branched nanofibers structures, it may be particularly advantageous to deposit the bottom conduction-controlling layer, as well as each of the different layers (possibly excluding the top-most odd-numbered electrode layer) in the layered stack as a very thin conformal film, capable of reproducing the extremely fine corrugation of the CNFs.

According to various embodiments, the electrically conductive vertical nanostructures may be grown nanostructures. The use of grown nanostructures allows extensive tailoring of the properties of the nanostructures. For instance, the growth conditions may be selected to achieve a morphology giving a large surface area of each nanostructure, which may in turn increase the energy storage capability of the MIM energy storage device.

According to embodiments, the MIM energy storage device can provide for storage of electrostatic or electrochemical energy or of a combination thereof.

According to embodiments, the conduction controlling material or materials may be solid dielectric(s), and the MIM energy storage device may be a nanostructure multilayer capacitor device.

According to other embodiments, the conduction controlling material or materials may be electrolyte(s), and the MIM energy storage device may be a nanostructure multilayer battery device.

By "solid dielectric" should be understood a dielectric material that is in a solid state in room temperature. Accordingly, this wording excludes any materials that are liquids in room temperature.

By "solid electrolyte" should be understood a electrolyte material that is in a solid state or sol-gel state in room temperature.

The solid dielectric may advantageously be a so-called high-k dielectric. Examples of high k-dielectric materials include, e.g. HfOx, TiOx, TaOx and other well-known high k dielectrics. Alternatively, the dielectric can be polymer based e.g. polypropylene, polystyrene, poly(p-xylylene), parylene etc. Other well-known dielectric materials, such as $Al_2O_x$, SiOx or SiNx, etc may also be used. The present invention contemplates to use at least one dielectric material layer where needed. More than one dielectric materials or multiple layers of dissimilar dielectric layers are also envisaged to control the effective dielectric properties or electric field properties.

In a nanostructure electrochemical storage or battery, the conduction controlling material primarily involves ions as part of the energy storage mechanism present in the conduction controlling material, such as by providing for energy storage by allowing transport of ions through the conduction controlling material. Suitable electrolytes may be solid or semi-solid electrolytes, and may be chosen forms of solid crystals, ceramic, garnet or polymers or gel to act as electrolyte e.g. strontium titanate, yttria-stabilized zirconia, PMMA, KOH, lithium phosphorus oxynitride, Li based composites etc. The electrolyte layer may include a polymer electrolyte. The polymer electrolyte may include a polymer matrix, an additive, and a salt.

The conduction controlling electrolyte materials may be deposited using CVD, thermal processes, spin coating or spray coating or any other suitable method used in the industry.

According to embodiments of the invention, the conduction controlling material may comprise a solid dielectric and an electrolyte in a layered configuration. In such embodiments, the MIM energy storage device may be seen as a hybrid between a capacitor-type (electrostatic) and a battery-type (electrochemical) energy storage device. This configuration may provide for a higher energy density and power density than a pure capacitor device and faster charging than a pure battery device.

The present invention contemplates to use any substrate for example, Si, glass, SiC, stainless steel, metal foil e.g. Al/Cu/Ag etc. foil or any other suitable substrate used in the industry. The substrate can present a substantially flat surface or can be non-flat.

The present invention contemplates to use any metal or metal alloy or doped silicon or metal oxide e.g. LiCoO2 etc. as per design and performance need of the energy storage component. For example, a metal layer may include a transition metal oxide, a composite oxide of lithium and a transition metal, or a mixture thereof. The transition metal oxide may include lithium cobalt oxide, lithium manganese oxide, or vanadium oxide. A metal contact layer may include one selected from the group consisting of Li, silicon tin oxynitride, Cu, and a combination thereof.

The present invention also contemplates the substrate to be used as or included in the bottom electrode. The present invention is based upon the realization that a cost-efficient and extremely compact, in particular thin, discrete metal-insulator-metal (MIM) energy storage component can be realized using a MIM-arrangement comprising a plurality of vertically grown conductive nanostructures. Through embodiments of the present invention, passive energy storage components with profile height below 100 μm can be achieved, and they can be a competitive alternative to currently existing MLCC/TSC components. The reduced component height may allow more efficient utilization of the available space on a circuit board. For instance, the very thin discrete MIM capacitor or battery components according to embodiments of the present invention could be arranged on the bottom side of an integrated circuit (IC)-package, which provides for a more compact circuit layout, as well as a shorter conductor distance between IC and capacitors. At least the latter of these provides for reduced parasitic capacitances and inductances, which in turn provides for improved performance of the IC.

The present invention however does not exclude the possibilities to manufacture thicker components, with more than 100 μm profile height which maybe suitable to be used in other industrial applications where the profile height is not constrained.

Embodiments of the present invention can fulfil the requirement of (a) very high electrostatic or electrochemical capacitance value per unit area/volume, (b) low profile in 2D and Z direction, (c) surface mount compatible and suitable for 2D, 2.5D and 3D packaging/assembly/embedded technologies, (d) easy to design form factor, (e) Stable and robust performance against temperature and applied voltages (f) low equivalent series inductance (ESL) per square, (g) longer life time or enhanced life cycle without capacitive degradation and (h) cost effective.

According to various embodiments of the present invention, the topmost electrode layer in the layered stack may completely fill a space between adjacent nanostructures in the plurality of conductive nanostructures, at least halfway between the first end and the second end of the nanostructures, from the first end towards the second end. This configuration may increase the robustness and reliability of the MIM energy storage device, which in turn provides for a more robust and reliable energy storage device. In particular, the mechanical stability of the nanostructures in the MIM energy storage device can be increased. Furthermore, the potential occurrence of voids between nanostructures can be decreased, which may be beneficial for the reliability of the energy storage components, especially in respect of temperature cycling etc.

In embodiments, the topmost electrode layer in the layered stack may completely fill the space between adjacent nanostructures in the plurality of conductive nanostructures, all the way to the second end of the nanostructures, which may improve the robustness and reliability of the energy storage device even further.

Moreover, the MIM energy storage device according to embodiments of the first aspect of the present invention may advantageously be included in an electronic device, further comprising a printed circuit board (PCB); and an integrated circuit (IC) on the PCB. The discrete MIM energy storage device may be connected to the IC via a conductor pattern on the PCB. Alternatively, the discrete MIM energy storage device may be connected to the IC-package. The circuit board need not necessarily be a conventional PCB, but may be a flexible printed circuit (FPC) or an SLP (substrate-like PCB).

Further, the MIM energy storage device according to embodiments of the first aspect of the present invention may advantageously be included in an electronic device, further comprising a first electrical circuit element electrically and mechanically connected to the first plurality of pads on the first side of the redistribution layer of the MIM energy storage device; and a second electrical circuit element electrically and mechanically connected to the second plurality of pads on the second side of the redistribution layer of the MIM energy storage device. In these embodiments, the MIM energy storage device additionally functions as an interposer between the first circuit element and the second circuit element. Each or either of the first electrical circuit element and the second electrical circuit element may be any electrical part of an electronic device, including, for example, an integrated circuit, a packaged electronic component, or a circuit board like PCB FR-4 substrate.

According to a second aspect of the invention, it is provided a method of manufacturing a metal-insulator-metal (MIM) energy storage device, comprising the steps of: providing a substrate with a bottom electrode; providing, on the bottom electrode, a plurality of electrically conductive nanostructures in such a way that each nanostructure in the plurality of electrically conductive nanostructures extends substantially vertically from the bottom electrode and a first end of the nanostructure is in electrically conductive contact with the bottom electrode; applying a conformal bottom conduction-controlling layer on each nanostructure in the plurality of electrically conductive nanostructures provided on the bottom electrode; and forming, on the bottom conduction-controlling layer, a layered stack of alternating conduction-controlling layers and electrode layers conformally coating the bottom conduction-controlling layer, the layered stack including at least a first odd-numbered electrode layer at a bottom of the layered stack, a first odd-numbered conduction-controlling layer directly on the first odd-numbered electrode layer, and a first even-numbered electrode layer directly on the first odd-numbered conduction-controlling layer, wherein the layered stack is formed in such a way that each even-numbered electrode layer in the layered stack is electrically conductively connected to the bottom electrode, and each odd-numbered electrode layer in the layered stack is electrically conductively connected to any other odd-numbered electrode layer in the layered stack.

Further embodiments of, and effects obtained through this second aspect of the present invention are largely analogous to those described above for the first aspect of the invention.

In summary, the present invention thus relates to a MIM energy storage device comprising a bottom electrode; a plurality of electrically conductive vertical nanostructures; a bottom conduction-controlling layer conformally coating each nanostructure in the plurality of electrically conductive vertical nanostructures; and a layered stack of alternating conduction-controlling layers and electrode layers conformally coating the bottom conduction-controlling layer, the layered stack including at least a first odd-numbered electrode layer at a bottom of the layered stack, a first odd-numbered conduction-controlling layer directly on the first odd-numbered electrode layer, and a first even-numbered electrode layer directly on the first odd-numbered conduction-controlling layer. Each even-numbered electrode layer in the layered stack is electrically conductively connected to the bottom electrode; and each odd-numbered electrode layer in the layered stack is electrically conductively connected to any other odd-numbered electrode layer in the layered stack.

According to aspects, the present invention also relates to a metal-insulator-metal (MIM) energy storage device comprising:

a first electrode layer;

a plurality of conductive nanostructures provided on the first electrode layer;

a first conduction-controlling material layer conformally coating each nanostructure in the plurality of conductive nanostructures and the first electrode layer left uncovered by the conductive nanostructures;

a second electrode layer conformally coating the first conduction-controlling layer;

a second conduction-controlling layer conformally coating the second electrode layer; and a third electrode layer conformally coating the second conduction-controlling layer, wherein the first electrode layer and the third electrode layer are electrically conductively connected to each other.

The MIM energy storage device may further comprise:

a third conduction-controlling layer conformally coating the third electrode layer; and a fourth electrode layer conformally coating the third conduction-controlling layer, wherein the second electrode layer and the fourth electrode layer are electrically conductively connected to each other.

The MIM energy storage device may be comprised in a discrete metal-insulator-metal (MIM) energy storage component further comprising:

a first connecting structure for external electrical connection of the energy storage component;

a second connecting structure for external electrical connection of the energy storage component; and an electrically insulating encapsulation material at least partly embedding the MIM-arrangement, wherein the first and third electrode layers are electrically conductively connected to the first connecting structure and the second electrode layer is electrically conductively connected to the second connecting structure.

The present invention also relates to a metal-insulator-metal (MIM) energy storage device comprising:

a first electrode layer;

a plurality of electrically conductive vertical nanostructures, each extending from a first end in electrically conductive contact with the first electrode layer to a second end; and a layered stack of alternating conduction-controlling layers and electrode layers conformally coating each nanostructure in the plurality of conductive nanostructures and the first electrode layer left uncovered by the conductive nanostructures, wherein:

a layer in the layered stack directly on the plurality of conductive nanostructures is a first conduction-controlling layer;

a layer in the layered stack directly on the first conduction-controlling layer is a second electrode layer;

a layer in the layered stack directly on the second electrode layer is a second conduction-controlling layer;

a layer in the layered stack directly on the second conduction-controlling layer is a third electrode layer; and the first electrode layer and the third electrode layer are electrically conductively connected to each other.

A layer in the layered stack directly on the third electrode layer may be a third conduction-controlling layer;

a layer in the layered stack directly on the third conduction-controlling layer may be a fourth electrode layer; and the second electrode layer and the fourth electrode layer may be electrically conductively connected to each other.

The layered stack may comprise an odd number of electrode layers;

even numbered electrode layers starting from a bottom of the layered stack are electrically conductively connected to the first electrode layer; and odd numbered electrode layers starting from a bottom of the layered stack are electrically conductively connected to a top-most electrode layer at the top of the layered stack.

The MIM energy storage device may further comprise a substantially plane top electrode parallel to the first electrode layer; and the top-most electrode layer at the top of the layered stack may be electrically conductively connected to the top electrode.

The top-most electrode layer at the top of the layered stack may be electrically conductively connected to the top electrode at a plurality of connection locations, each being along a continuation of a line running from the first end to the second end of a respective one of the nanostructures in plurality of electrically conductive vertical nanostructures.

Furthermore, the present invention relates to a discrete metal-insulator-metal (MIM) energy storage component comprising:

a MIM-arrangement comprising:
  a first electrode layer;
  a plurality of conductive nanostructures grown from the first electrode layer;
  a first conduction-controlling material layer conformally coating each nanostructure in the plurality of conductive nanostructures and the first electrode layer left uncovered by the conductive nanostructures;
  a second electrode layer conformally coating the first conduction-controlling layer;
  a second conduction-controlling layer conformally coating the second electrode layer; and
  a third electrode layer conformally coating the second conduction-controlling layer;

a first connecting structure for external electrical connection of the energy storage component;

a second connecting structure for external electrical connection of the energy storage component; and an electrically insulating encapsulation material at least partly embedding the MIM-arrangement, wherein the first and third electrode layers are electrically conductively connected to the first connecting structure and the second electrode layer is electrically conductively connected to the second connecting structure.

BRIEF DESCRIPTION OF THE DRAWINGS

These and other aspects of the present invention will now be described in more detail, with reference to the appended drawings showing an example embodiment of the invention, wherein:

FIG. 1 schematically illustrates an application for MIM energy storage devices according to embodiments of the present invention, in the form of a schematic mobile phone;

FIG. 2 schematically illustrates an example of a circuit board according to the prior art, which may represent a typical circuit board in a current electronic device;

FIG. 3 schematically illustrates possible implications of replacing the conventional energy storage components on the circuit board in FIG. 2 with energy storage devices according to an example embodiment of the present invention;

FIG. 4B is a schematic cross-section view of the MIM energy storage device in FIG. 4A;

DETAILED DESCRIPTION OF EXAMPLE EMBODIMENTS

Figure 4A:
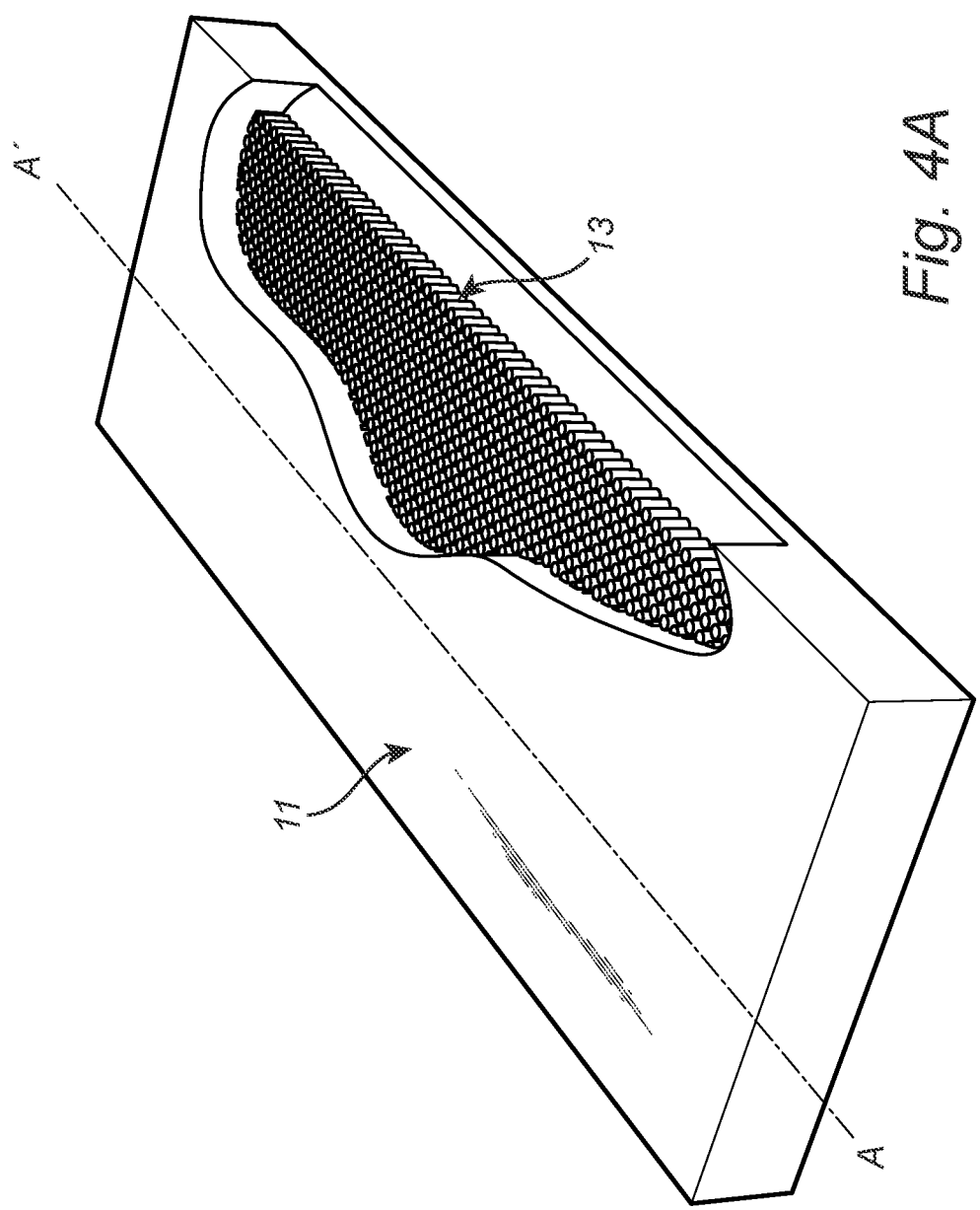
FIG. 4A is a partly opened perspective schematic illustration of a MIM energy storage device according to a first example embodiment of the present invention, in the form of a discrete MIM energy storage component, such as a discrete capacitor component.

FIG. 1 schematically illustrates an electronic device according to an embodiment of the present invention, here in the form of a mobile phone 1. In the simplified and schematic illustration in FIG. 1, it is indicated that the mobile phone, like most electronic devices, comprises a circuit board 3, populated with packaged integrated circuits 5, and passive components, including energy storage components, here in the form of capacitors 7.

In FIG. 2, which is an exemplary illustration of a circuit board 3 using technology that is currently available for rational and cost-efficient mass-production, there is a large number of capacitors 7 mounted on a printed circuit board (PCB) 9. The capacitors 7 presently used are often so-called multilayer ceramic capacitors (MLCCs), with a minimum package height of about 0.4 mm.

To provide for even more compact electronic devices, with even higher processing speeds, it would be desirable to reduce the space occupied by the capacitors 7 needed for decoupling and temporary energy storage, and to reduce the distance between an IC 5 and the capacitors 7 serving that IC 5.

This can be achieved using MIM energy storage devices according to embodiments of the present invention, in this case discrete MIM-capacitor components, since such MIM-capacitor components can be made with a considerably smaller package height than conventional MLCCs with the same capacitance and footprint.

FIG. 3 is a schematic illustration of possible implications of replacing the conventional capacitor components on the circuit board in FIG. 2 with MIM-capacitor components 11 according to an example embodiment of the present invention. As is evident from FIG. 3, the decreased package height of MIM-capacitor components 11 according to embodiments of the present invention allows placement of the capacitors 11 under the IC-package 5, between the connecting balls 12 of the IC-package 5. Obviously, this arrangement of the capacitors 11 allows for a smaller PCB 9, and thus for a more compact electronic device 1. Shorter distances between active circuitry in the IC 5 and the capacitors 11 are clearly also provided for.

FIG. 4A is a partly opened perspective schematic illustration of a MIM energy storage device 11 according to a first example embodiment of the present invention, in the form of a discrete MIM energy storage component, such as a discrete capacitor component, comprising a MIM-arrangement 13, a first connecting structure (not visible in FIG. 4A), a second connecting structure (not visible in FIG. 4A), and a dielectric encapsulation material, at least partly embedding the MIM-arrangement 13 to at least partly form an outer boundary surface of the energy storage component 11.

FIG. 4B is a schematic cross-section view of the MIM energy storage device 11 in FIG. 4A, of the section taken along the line A-A' in FIG. 4A. In FIG. 4B, it can be seen that this embodiment of the MIM energy storage device comprises a MIM energy storage device layer 21, a connecting structure layer 23, and a redistribution layer 25 arranged between the MIM energy storage device layer 21 and the connecting structure layer 23. The MIM energy storage device layer 21 comprises a bottom electrode 27, a plurality of electrically conductive vertical nanostructures 29 (only one of these is indicated by a reference numeral in FIG. 4B to avoid cluttering the drawings), a bottom conduction-controlling layer 31, and a layered stack 33 comprising alternating conduction-controlling layers and electrode layers conformally coating the bottom conduction-controlling layer 31. Example configurations of the MIM energy storage device layer 21 will be described in greater detail below, with reference to FIGS. 5A-B and other illustrations.

The connecting structure layer 23 comprises the first connecting structure 15 and the second connecting structure 17 referred to above with reference to FIG. 4A, for external electrical connection of the MIM energy storage device 11. As is schematically indicated in FIG. 4B, the first connecting structure 15 is electrically conductively connected to the bottom electrode 27, and the second connecting structure 17 is electrically conductively connected to selected electrode layers in the layered stack 33. In particular, the second connecting structure 17 is electrically conductively connected to each odd-numbered electrode layer in the layered stack 33. This will become clearer below, when the configuration of the layered stack 33 is explained in greater detail with reference to FIGS. 5A-B and other illustrations.

The redistribution layer 25 is configured to electrically conductively connect the bottom electrode 27 of the MIM energy storage device layer 21 with the first connecting structure 15 of the connecting structure layer 23, and electrically conductively connecting at least one odd-numbered electrode layer in the layered stack 33 of the MIM energy storage device layer 21 with the second connecting structure 17 of the connecting structure layer 23.

As is schematically shown in FIG. 4B, the electrically insulating encapsulation material 19 embeds the first 15 and second 17 connecting structures, while leaving the first 15 and second 17 connecting structures uncovered. The outer boundary surface of the MIM energy storage device 11 is formed by the encapsulation material 19 and the first 15 and second 17 connecting structures.

Figure 5A:
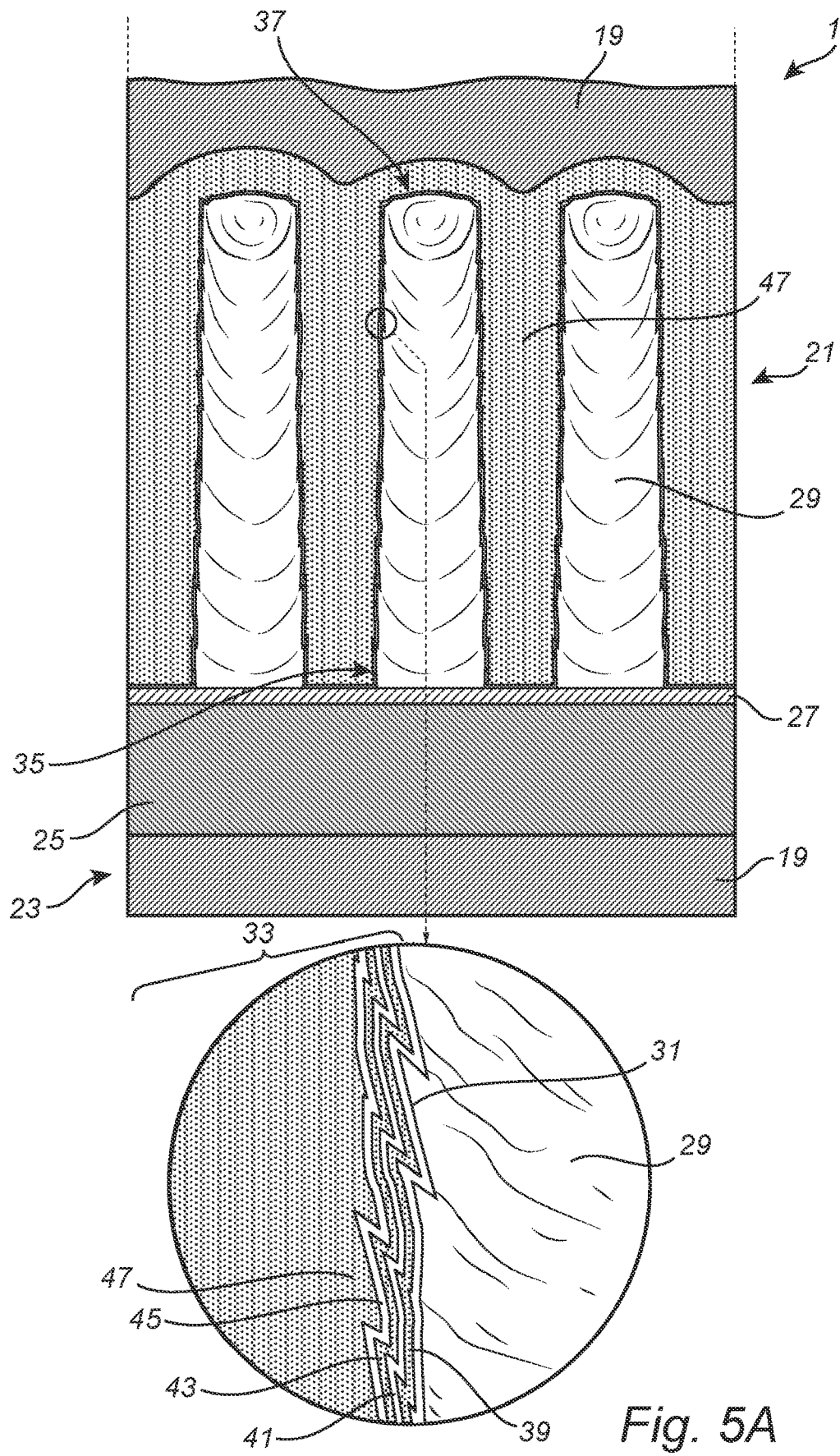
FIG. 5A is an enlarged illustration of a first example configuration of the MIM energy storage device in FIGS. 4A-B.

FIG. 5A is an enlarged illustration of a first example configuration of the MIM energy storage device 11 in FIGS. 4A-B. As is schematically shown in FIG. 5A, each of the electrically conductive vertical nanostructures 29 extends from a first end 35 in electrically conductive contact with the bottom electrode 27 to a top end 37. As is best seen in the enlarged portion of FIG. 5A, the bottom conduction-controlling layer 31 conformally coats the nanostructures 29. In the example configuration of FIG. 5A, the bottom conduction-controlling layer 31 additionally conformally coats the portions of the bottom electrode 27 that are not covered by the nanostructures 29.

With continued reference to the enlarged portion of FIG. 5A, the layered stack 33 of alternating conduction-controlling layers and electrode layers coats the bottom conduction-controlling layer 31 and includes at least a first odd-numbered (first) electrode layer 39 at a bottom of the layered stack 33, a first odd-numbered (first) conduction-controlling layer 41 directly on the first odd-numbered electrode layer 39, and a first even-numbered (second) electrode layer 43 directly on the first odd-numbered conduction-controlling layer 41. In the example configuration of FIG. 5A, the layered stack 33 additionally includes a first even-numbered (second) conduction-controlling layer 45, and a second odd-numbered (third) electrode layer 47. Although not shown in FIG. 5A, each even-numbered electrode layer (the second electrode layer 43) in the layered stack 33 is electrically conductively connected to the bottom electrode 27, and each odd-numbered electrode layer (the first electrode layer 39 and the third electrode layer 47) in the layered stack 33 is electrically conductively connected to any other odd-numbered electrode layer in the layered stack (to each other).

In embodiments where the MIM energy storage device 11 is a capacitor, each conduction-controlling layer is made of solid dielectric.

In the example configuration of FIG. 5A, the topmost electrode layer (in this case the third electrode layer 47) completely fills a space between adjacent nanostructures 29 more than halfway between the first end 35 and the second end 37 of the nanostructures 29. In the exemplary configuration in FIG. 5A, the topmost electrode layer 47 completely fills the space between adjacent nanostructures 29, all the way from the first end 35 to the second end 37, and beyond.

Although not shown in FIG. 5A, it should be understood that any layer in the layered stack may be formed by sublayers. In particular the topmost electrode layer 47 may comprise a first sublayer conformally coating the directly underlying conduction-controlling layer 45, and a second sublayer filling up the space between the nanostructures 29. Moreover, additional sub layer(s) for example as metal diffusion barrier not shown in the figure may conveniently be present in accordance with the present invention disclosure.

A second example configuration of the MIM energy storage device 11 will now be described with reference to FIG. 5B. The MIM energy storage device 11 in FIG. 5B mainly differs from that described above with reference to FIG. 5A in that the nanostructures 29, and the layered stack 33, are embedded in dielectric material 49, which may for example be applied using spin-coating, spray coating, or dipping, etc.

Figure 5B:
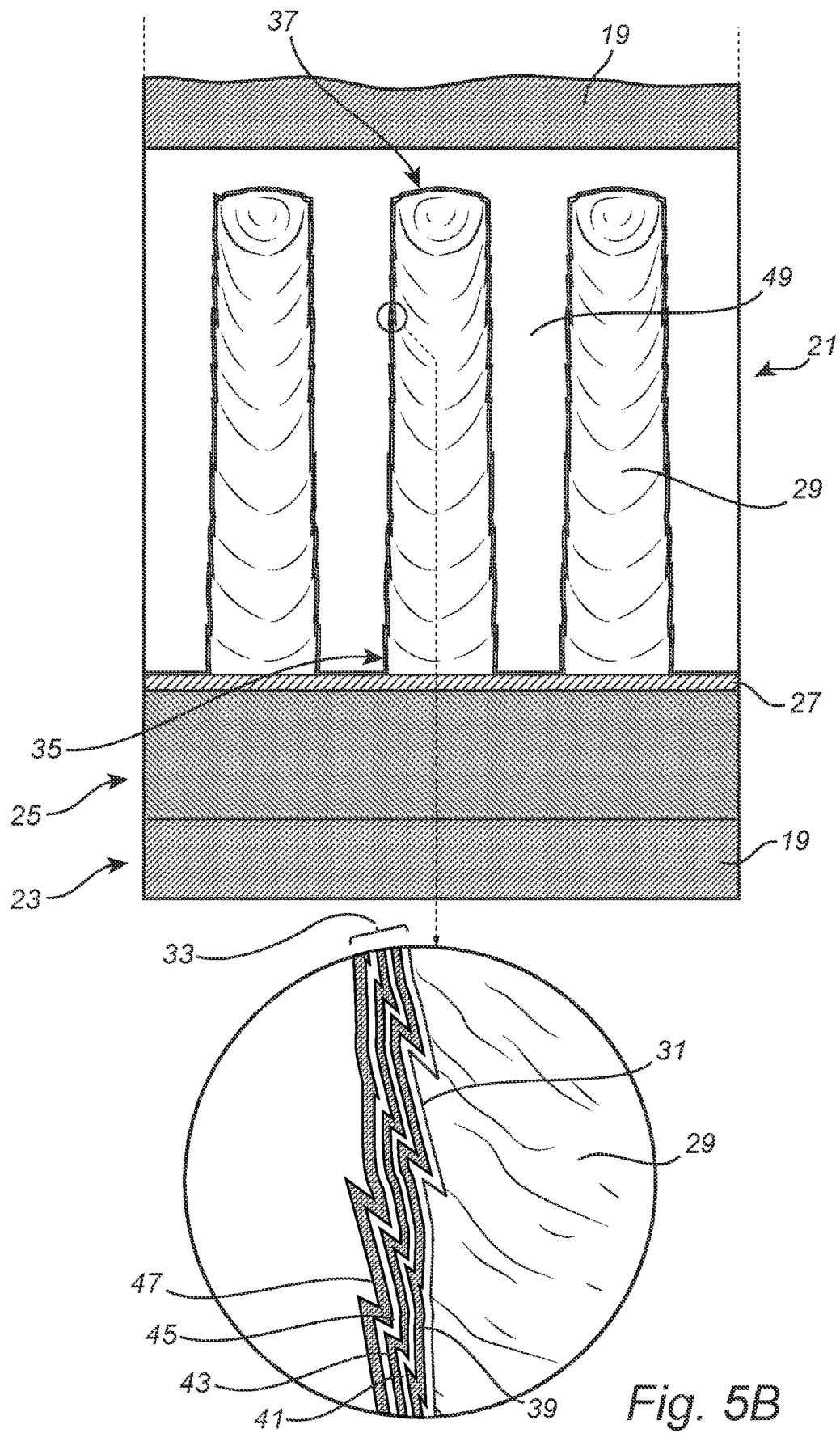
FIG. 5B is an enlarged illustration of a second example configuration of the MIM energy storage device in FIGS. 4A-B.

It should be understood that the MIM energy storage device 11 configurations in FIGS. 5A-B can be modified from the capacitor configurations shown to energy storage/battery configurations. In such configurations, the conduction-controlling layers are not made of solid dielectric, but of electrolyte, preferably solid electrolyte. Devices with combinations of solid dielectric and electrolyte layers are also envisaged.

Figure 6A:
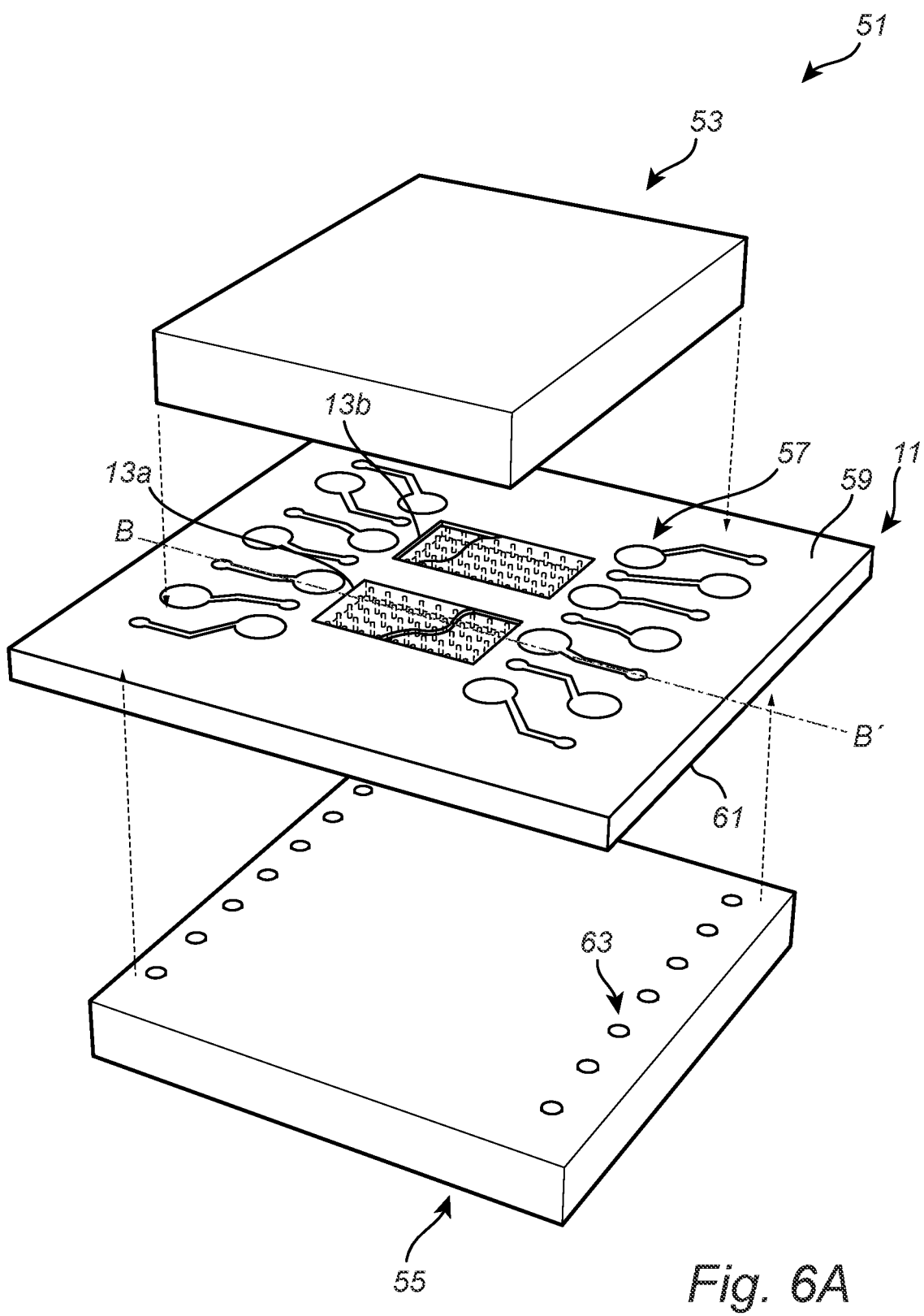
FIG. 6A is a perspective schematic illustration of a MIM energy storage device according to a second example embodiment of the present invention, in the form of a combined interposer and energy storage device.

FIG. 6A is a perspective schematic illustration of a MIM energy storage device 11 according to a second example embodiment of the present invention, in the form of a combined interposer and energy storage device. In FIG. 6A, the MIM energy storage device is illustrated as being comprised in an electronic device 51 according to an embodiment of the present invention, comprising a first electrical circuit element, here in the form of a first integrated circuit (IC) 53, a second electrical circuit element, here in the form of a second IC 55, and the MIM energy storage device 11, electrically and mechanically interconnecting the first IC 53 and the second IC 55.

As is schematically shown in FIG. 6A, the MIM energy storage device (interposer) 11 comprises first 13a and second 13b MIM arrangements. Although not indicated by reference numerals in FIG. 6A (but in FIG. 6B), the first 13a and second 13b MIM arrangements are arranged in a MIM energy storage device layer, and the interposer 11 further comprises first and second connecting structure layers, and a redistribution layer for coupling various structures in the MIM energy storage device layer to connecting structures in the connecting structure layers. The interposer 11 comprises a first plurality of pads 57 on a first side 59 of the interposer 11 and a second plurality of pads (not visible in FIG. 6A) on a second side 61 of the interposer 11. The pads in the first plurality of pads 57 are arranged and configured for electrical and mechanical connection to corresponding pads of the first IC 53, and pads in the second plurality of pads are arranged and configured for electrical and mechanical connection to corresponding pads 63 of the second IC 55. As is better seen in FIG. 6B, the interposer 11 additionally comprises a plurality of vias, each passing through the interposer 11 (at least the redistribution layer(s) of the interposer 11) to electrically conductively connect a respective pad in the first plurality of pads 57 with a respective pad in the second plurality of pads.

In the example of FIG. 6A the first IC 53 is coupled to the second IC 55 by the interposer 11, and both the first IC 53 and the second IC 55 are connected to the MIM arrangements 13a-b of the interposer 11. Hereby, the interposer 11 can, for example, be charged by electrical energy provided from the second IC 55, and discharged to the first IC 53. Thus, the interposer 11 can function as a charge reservoir for the first IC 53 and/or the second IC 55.

It should be noted that many other conductor patterns than that shown in FIG. 6A are possible and may be advantageous depending on the particular application. For example, additional conductor patterns maybe present for power grid and signal routing purposes.

Figure 6B:
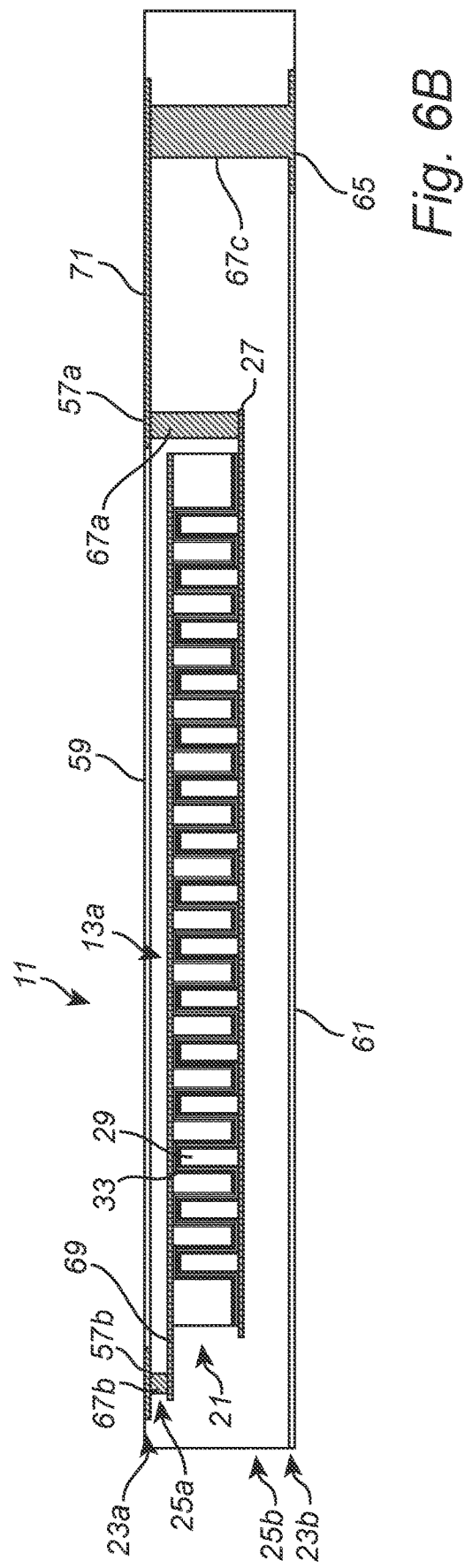
FIG. 6B is a schematic cross-section view of the MIM energy storage device in FIG. 6A.

FIG. 6B is a schematic partial cross-section view of the MIM energy storage device 11 in FIG. 6A of the section taken along the line B-B' in FIG. 6A. As can be seen in FIG. 6B, the above-mentioned first 23a and second 23b connecting structure layers are electrically conductively connected to the MIM energy storage device layer 21 via first 25a and second 25b redistribution layers. On the first side 59 of the interposer 11 a first 57a and a second 57b pad are visible in the cross-section view in FIG. 6B, and on the second side 61 of the interposer 11, a single pad 65 is visible. As is schematically indicated in FIG. 6B, the first pad 57a on the first side 59 of the interposer 11 is electrically conductively connected to the bottom electrode 27 of the MIM energy storage device layer 21 through a first via 67a. The second pad 57b on the first side 59 of the interposer 11 is electrically conductively connected to a top electrode 69 of the MIM energy storage device layer 21 through a second via 67b. The first pad 57a on the first side 59 of the interposer 11 is additionally electrically conductively connected to the pad 65 on the second side 61 of the interposer through a conductor trace 71 in the first connecting structure layer 23a and a third via 67c.

Figure 7A:
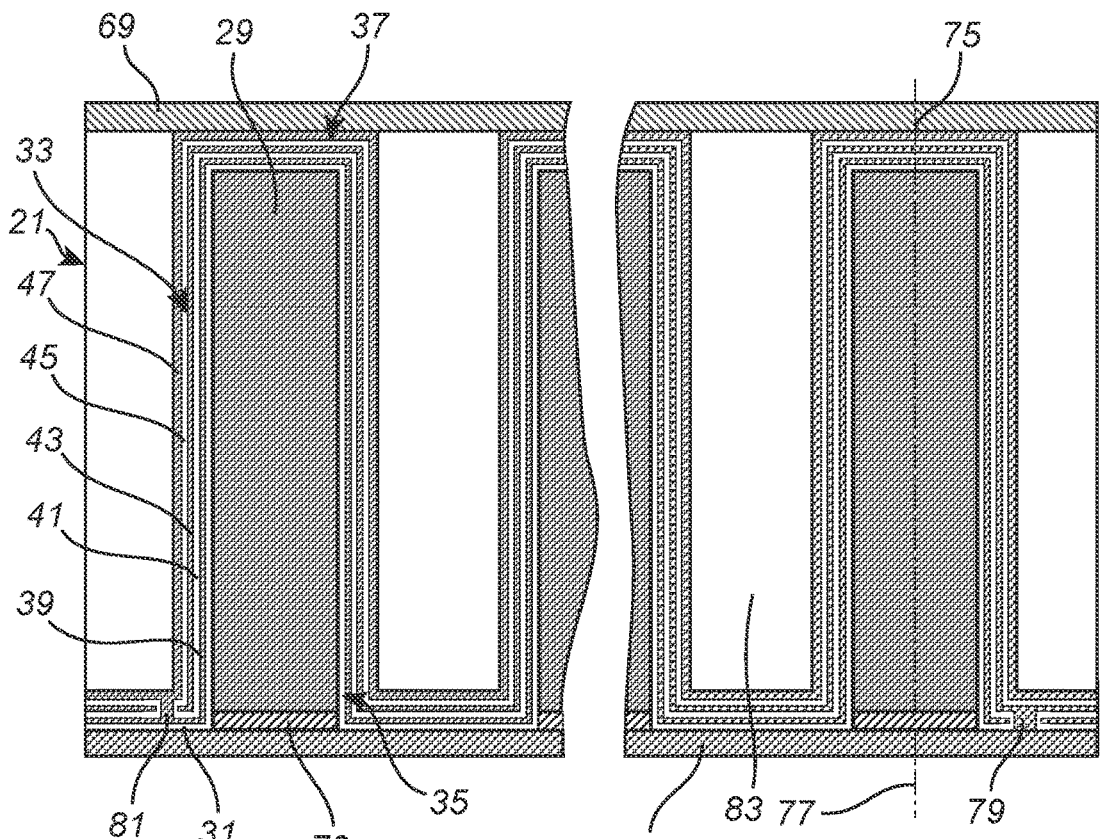
FIG. 7A is an enlarged illustration of a first example configuration of the MIM energy storage device in FIGS. 6A-B.
Figure 7B:
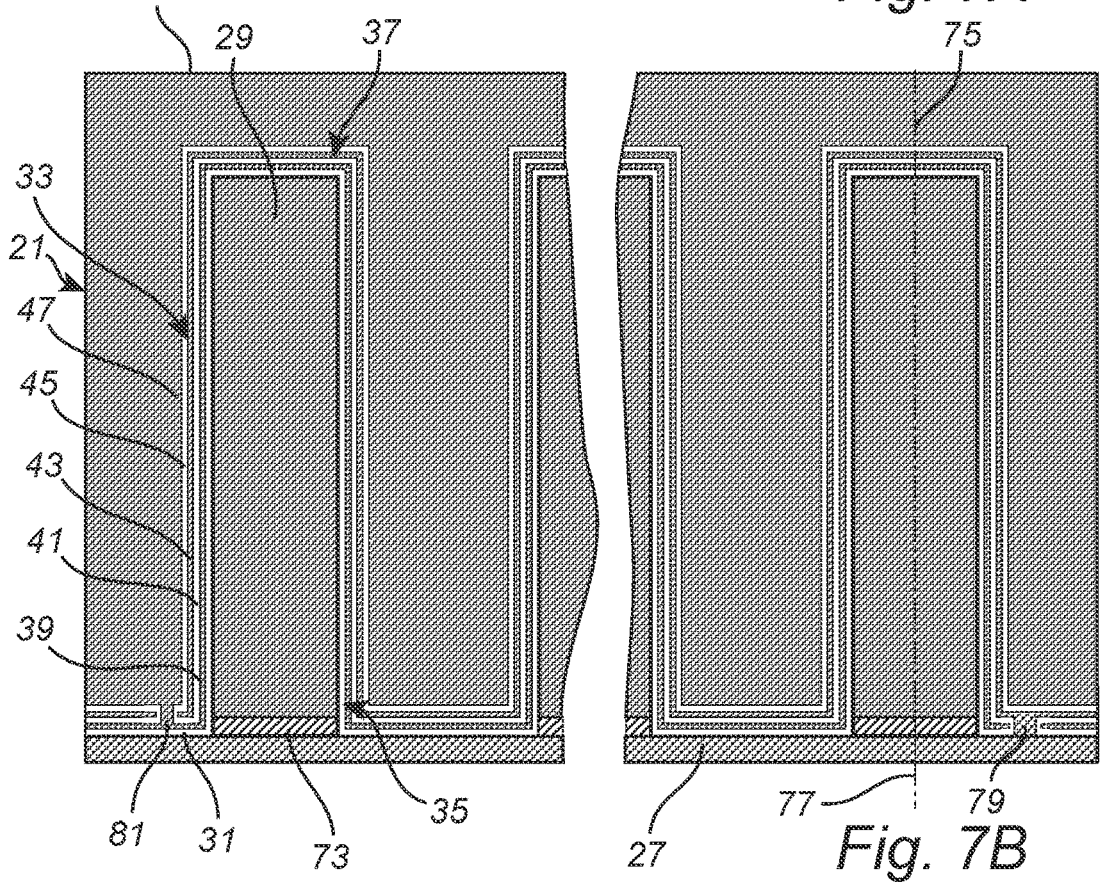
FIG. 7B is an enlarged illustration of a second example configuration of the MIM energy storage device in FIGS. 6A-B.

FIG. 7A and FIG. 7B are partial cross-section views of different configurations of the MIM energy storage layer 21 in the MIM energy storage device 11 in FIGS. 6A-B. It should be noted that the configurations in FIG. 7A and FIG. 7B may be used for the MIM energy storage device 11 described with reference to FIG. 4A and FIG. 4B, and that the configurations described above with reference to FIG. 5A and FIG. 5B may be used for the MIM energy storage device 11 in FIG. 6A and FIG. 6B.

Turning first to FIG. 7A, the electrically conductive vertical nanostructures 29 are here grown from a catalyst layer 73 pre-patterned on the bottom electrode 27 in a periodic configuration. The nanostructures 29 may, for example, be conductive carbon nanostructures, such as carbon nanofibers, grown from the catalyst layer 73 using, per se, known tip growth, so that each nanostructure 29 includes catalyst material at the second end 37 of the nanostructure 29.

As was described above with reference to FIG. 5A and FIG. 5B, the bottom conduction-controlling layer 31 conformally coats the nanostructures 29 and the portions of the bottom electrode 27 that are not covered by the nanostructures 29.

The layered stack 33 of alternating conduction-controlling layers and electrode layers coats the bottom conduction-controlling layer 31 and includes at least a first odd-numbered (first) electrode layer 39 at a bottom of the layered stack 33, a first odd-numbered (first) conduction-controlling layer 41 directly on the first odd-numbered electrode layer 39, and a first even-numbered (second) electrode layer 43 directly on the first odd-numbered conduction-controlling layer 41. In the example configuration of FIG. 7A, the layered stack 33 additionally includes a first even-numbered (second) conduction-controlling layer 45, and a second odd-numbered (third) electrode layer 47. In the example configuration of FIG. 7A, the third electrode layer 47 is the topmost odd-numbered electrode layer in the layered stack 33, and as can be seen in FIG. 7A, this electrode layer 47 is electrically conductively connected to the top electrode 69 at a plurality of connection locations 75 (only one of these is indicated by a reference numeral in FIG. 7A to avoid cluttering the drawings), each being along a straight line 77 passing through the first end 35 and the second end 37 of the respective nanostructure 29.

Each even-numbered electrode layer (the second electrode layer 43) in the layered stack 33 is electrically conductively connected to the bottom electrode 27, and each odd-numbered electrode layer (the first electrode layer 39 and the third electrode layer 47) in the layered stack 33 is electrically conductively connected to any other odd-numbered electrode layer in the layered stack (to each other), and thus also to the top electrode 69. In the example configuration of FIG. 7A, the second electrode layer 43 and the bottom electrode 27 are connected together by a first interconnect 79, and the first electrode layer 39 and the third electrode layer 47 are connected together by a second interconnect 81. In the first example configuration of FIG. 7A, the space between the nanostructures 29 is filled by dielectric material 83. When forming the MIM energy storage device layer 21 in FIG. 7A, the layered stack 33 may be covered by dielectric material 83, excess dielectric material may then be removed in a planarization process, until the topmost electrode layer 47 of the layered stack 33 is exposed. Thereafter, the top electrode 69 may be deposited.

In the second example configuration of FIG. 7B, the space between the nanostructures is instead filled with the topmost electrode layer 47, which is then planarized to form the top electrode 69.

Figure 8:
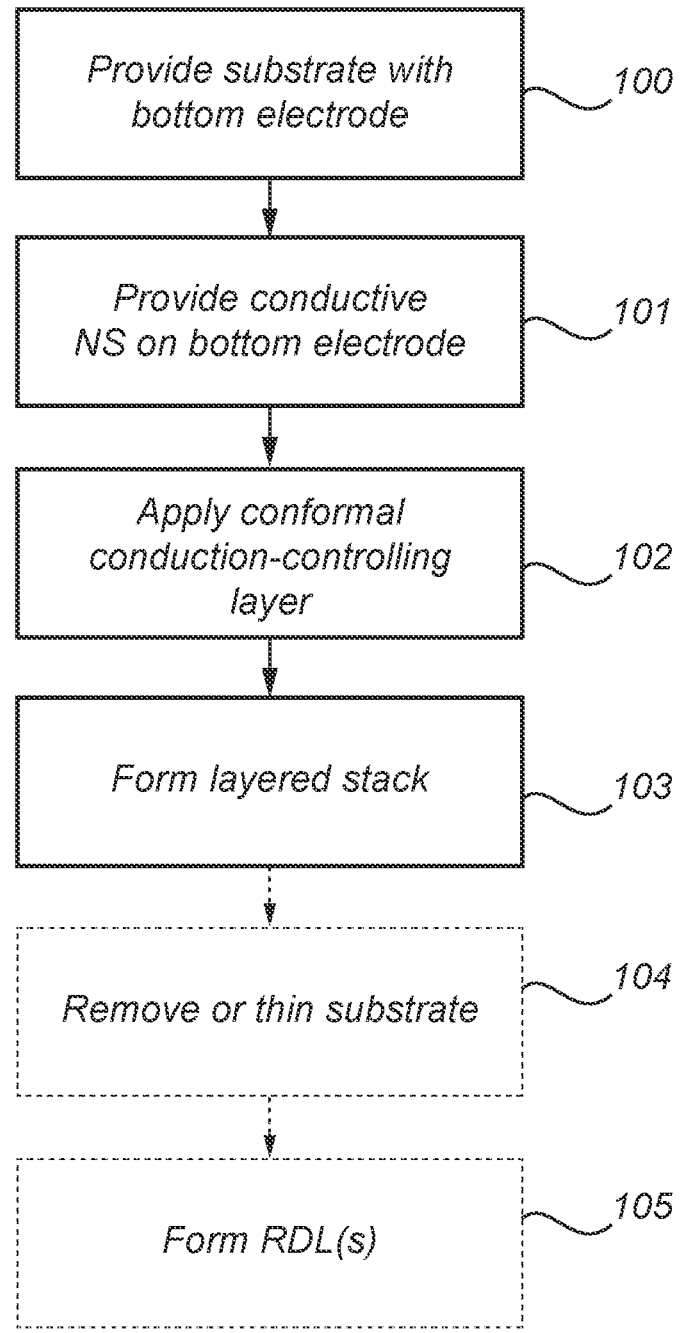
FIG. 8 is a flow-chart illustrating an example embodiment of a method according to embodiments of the present invention.

FIG. 8 is a flow-chart schematically illustrating a method according to an example embodiment of the present invention, for manufacturing a MIM energy storage device 11 according to embodiments of the invention.

In a first step 100, a substrate is provided. The substrate, which may for example be a glass, silicon, SiC, ceramic, or polymer substrate, has the above-mentioned bottom electrode 27 provided thereon. Between the substrate and the bottom electrode 27, there may be a so-called sacrificial layer.

In the subsequent step 101, a plurality of electrically conductive nanostructure 29 is provided in such a way that each nanostructure 29 extends substantially vertically from the bottom electrode 27 and a first end 35 of the nanostructure 29 is in electrically conductive contact with the bottom electrode 27. Advantageously, the nanostructures 29 may be grown from the bottom electrode 27, using, per se, known techniques for growing vertical nanostructures.

Thereafter, in step 102, the vertical nanostructures 29, and portions of the bottom electrode 27 left uncovered by the nanostructures 29, may be conformally coated by a bottom conduction-controlling layer 31. The bottom conduction-controlling layer 31, as well as additional conformal layers in the MIM energy storage device 11, may be deposited using any known method suitable for making conformal layers, such as for example via vapor deposition, thermal processes, atomic layer deposition (ALD), etc. Advantageously, the bottom conduction-controlling layer 31 may be coated uniformly with atomic uniformity over the nanostructures 29.

In the next step 103, a layered stack 33 comprising alternating conduction-controlling layers and electrode layers conformally coating the bottom conduction-controlling layer is formed on the bottom conduction-controlling layer 31. The layered stack includes at least a first odd-numbered electrode layer 39 at a bottom of the layered stack 33, a first odd-numbered conduction-controlling layer 41 directly on the first odd-numbered electrode layer 39, and a first even-numbered electrode layer 43 directly on the first odd-numbered conduction-controlling layer 41. The layered stack 33 is formed in such a way that each even-numbered electrode layer in the layered stack is electrically conductively connected to the bottom electrode, and each odd-numbered electrode layer in the layered stack is electrically conductively connected to any other odd-numbered electrode layer in the layered stack.

In an optional step 104, the substrate may be removed, for example by selectively removing the sacrificial layer when such a layer is present on the substrate. Alternatively, the substrate may be thinned, for example through chemical or mechanical polishing.

In an additional optional step 105, one or several layers, such as one or more redistribution layers and one or more connection structure layers may be formed using, per se, known methods and materials.

The person skilled in the art realizes that the present invention by no means is limited to the preferred embodiments described above. On the contrary, many modifications and variations are possible within the scope of the appended claims.

In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. Any reference signs in the claims should not be construed as limiting the scope.

The invention claimed is:

1. A metal-insulator-metal (MIM) energy storage device comprising:
   a plurality of electrically conductive vertical nanostructures, each extending from a first end of the nanostructure to a second end of the nanostructure;
   a bottom conduction-controlling layer conformally coating each nanostructure in the plurality of electrically conductive vertical nanostructures; and
   a layered stack comprising alternating conduction-controlling layers and electrode layers conformally coating the bottom conduction-controlling layer, the layered stack including at least a first odd-numbered electrode layer at a bottom of the layered stack, a first odd-numbered conduction-controlling layer directly on the first odd-numbered electrode layer, and a first even-numbered electrode layer directly on the first odd-numbered conduction-controlling layer,
   wherein:
   each even-numbered electrode layer in the layered stack is electrically conductively connected to the nanostructures; and
   each odd-numbered electrode layer in the layered stack is electrically conductively connected to any other odd-numbered electrode layer in the layered stack,
   wherein the electrically conductive vertical nanostructures in the plurality of electrically conductive vertical nanostructures are carbon nanofibers.

2. The MIM energy storage device according to claim 1, wherein:
   the MIM energy storage device further comprises a top electrode; and
   a topmost odd-numbered electrode layer in the layered stack is electrically conductively connected to the top electrode.

3. The MIM energy storage device according to claim 2, wherein the topmost odd-numbered electrode layer in the layered stack is electrically conductively connected to the top electrode at a plurality of connection locations, each being along a straight line passing through the first end and the second end of a respective one of the nanostructures in the plurality of electrically conductive vertical nanostructures.

4. The MIM energy storage device according to claim 1, wherein each of the carbon nanofibers has a corrugated surface structure and/or is a branched nanofiber.

5. The MIM energy storage device according to claim 1, wherein the nanostructures in the plurality of electrically conductive vertical nanostructures are grown from a bottom electrode.

6. The MIM energy storage device according to claim 5, further comprising a catalyst layer between the bottom electrode and the first end of each nanostructure in the plurality of electrically conductive vertical nanostructures.

7. The MIM energy storage device according to claim 6, wherein the catalyst layer is a pre-patterned catalyst layer.

8. The MIM energy storage device according to claim 7, wherein the catalyst layer is pre-patterned in a periodic configuration.

9. The MIM energy storage device according to claim 1, wherein each conduction-controlling layer is made of solid dielectric material.

10. The MIM energy storage device according to claim 1, wherein each conduction-controlling layer is an electrolyte.

11. The MIM energy storage device according to claim 1, further comprising:
    a first connecting structure for external electrical connection of the MIM energy storage device; and
    a second connecting structure for external electrical connection of the MIM energy storage device, wherein:
    the nanostructures and each even-numbered electrode layer in the layered stack are electrically conductively connected to the first connecting structure; and
    each odd-numbered electrode layer in the layered stack is electrically conductively connected to the second connecting structure.

12. The MIM energy storage device according to claim 11, wherein the MIM energy storage device comprises:
    a MIM energy storage device layer including the plurality of electrically conductive vertical nanostructures, the bottom conduction-controlling layer, and the layered stack;
    a connecting structure layer including the first connecting structure and the second connecting structure; and
    a redistribution layer arranged between the MIM energy storage device layer and the connecting structure layer, the redistribution layer being configured to electrically conductively connect the nanostructures of the MIM energy storage device layer with the first connecting structure of the connecting structure layer, and electrically conductively connecting at least one odd-numbered electrode layer in the layered stack of the MIM energy storage device layer with the second connecting structure of the connecting structure layer.

13. The MIM energy storage device according to claim 12, wherein the redistribution layer comprises:
    a first redistribution sub-layer having a first conductor pattern layer including a first pad electrically conductively connected to the nanostructures of the MIM energy storage device layer, and a second pad electrically conductively connected to at least one odd-numbered electrode layer in the layered stack of the MIM energy storage device layer; and
    a second redistribution sub-layer having a second conductor pattern layer including a first conductor trace electrically conductively connecting the first pad of the first redistribution sub-layer with the first connecting structure of the connecting structure layer, and a second conductor trace electrically conductively connecting the second pad of the first redistribution sub-layer with the second connecting structure of the connecting structure layer.

14. The MIM energy storage device according to claim 12, wherein the redistribution layer further comprises at least one via, passing through the redistribution layer to electrically conductively connect a first side of the redistribution layer with a second side of the redistribution layer.

15. The MIM energy storage device according to claim 11, wherein each of the first connecting structure and the second connecting structure at least partly forms an outer boundary surface of the MIM energy storage device.

16. An electronic device comprising:
    a printed circuit board (PCB);
    an integrated circuit (IC) on the PCB; and
    the MIM energy storage device according to claim 11 connected to the IC.

17. A method of manufacturing a metal-insulator-metal (MIM) energy storage device, comprising the steps of:

providing a substrate with a bottom electrode;

providing, on the bottom electrode, a plurality of electrically conductive nanostructures in such a way that each nanostructure in the plurality of electrically conductive nanostructures extends substantially vertically from the bottom electrode and a first end of the nanostructure is in electrically conductive contact with the bottom electrode;

applying a conformal bottom conduction-controlling layer on each nanostructure in the plurality of electrically conductive nanostructures provided on the bottom electrode; and forming, on the bottom conduction-controlling layer, a layered stack of alternating conduction-controlling layers and electrode layers conformally coating the bottom conduction-controlling layer, the layered stack including at least a first odd-numbered electrode layer at a bottom of the layered stack, a first odd-numbered conduction-controlling layer directly on the first odd-numbered electrode layer, and a first even-numbered electrode layer directly on the first odd-numbered conduction-controlling layer, wherein the layered stack is formed in such a way that each even-numbered electrode layer in the layered stack is electrically conductively connected to the bottom electrode, and each odd-numbered electrode layer in the layered stack is electrically conductively connected to any other odd-numbered electrode layer in the layered stack.

18. The method according to claim 17, further comprising the steps of:

forming a first connecting structure for external electrical connection of the MIM energy storage device;

forming a second connecting structure for external electrical connection of the MIM energy storage device; and at least partly embedding the MIM energy storage device in an electrically insulating encapsulation material, in such a way that the first connecting structure and the second connecting structure are uncovered by the electrically insulating encapsulation material.

* * * * *